(12) United States Patent
Sato et al.

(10) Patent No.: US 12,344,935 B2
(45) Date of Patent: Jul. 1, 2025

(54) SUBSTRATE PROCESSING APPARATUS, HEAT INSULATOR ASSEMBLY AND METHOD OF MANUFACTURING SEMICONDUCTOR DEVICE

(71) Applicant: Kokusai Electric Corporation, Tokyo (JP)

(72) Inventors: Akihiro Sato, Toyama (JP); Shuhei Saido, Toyama (JP); Kenta Kasamatsu, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 592 days.

(21) Appl. No.: 17/846,775

(22) Filed: Jun. 22, 2022

(65) Prior Publication Data

US 2022/0325413 A1 Oct. 13, 2022

Related U.S. Application Data

(63) Continuation of application No. PCT/JP2021/009625, filed on Mar. 10, 2021.

(30) Foreign Application Priority Data

Mar. 19, 2020 (JP) .................. 2020-050144

(51) Int. Cl.
*C23C 16/46* (2006.01)
*C23C 16/44* (2006.01)
(Continued)

(52) U.S. Cl.
CPC .......... *C23C 16/46* (2013.01); *C23C 16/4411* (2013.01); *C23C 16/4581* (2013.01);
(Continued)

(58) Field of Classification Search
CPC . C23C 16/46; C23C 16/4411; C23C 16/4581; C23C 16/4587; C23C 16/455;
(Continued)

(56) References Cited

U.S. PATENT DOCUMENTS

| 2001/0004140 A1* | 6/2001 | An | ........................ C23C 16/46 266/259 |
|---|---|---|---|
| 2007/0137794 A1* | 6/2007 | Qiu | ..................... C23C 16/4584 118/725 |

(Continued)

FOREIGN PATENT DOCUMENTS

| JP | 2012049380 A | * | 3/2012 | ............. C23C 16/46 |
|---|---|---|---|---|
| JP | 2012064804 A | | 3/2012 | |
| JP | 2019021910 A | | 2/2019 | |

OTHER PUBLICATIONS

JP 2012049380 A—Machine English Translation (Year: 2025).*

(Continued)

*Primary Examiner* — Jose R Diaz

(74) *Attorney, Agent, or Firm* — Edell, Shapiro & Finnan, LLC

(57) ABSTRACT

According to one aspect of a technique the present disclosure, there is provided a substrate processing apparatus including: a substrate retainer provided with a heat insulating region at a lower portion thereof; a first reaction tube with open upper and lower ends; a second reaction tube with a closed upper end and an open lower end; a furnace opening flange provided with a holder in a first space between the first reaction tube and the second reaction tube; a heater covering the second reaction tube to heat a substrate arranged in the substrate retainer in the first reaction tube; a first highly reflective structure provided in the heat insulating region; and a second highly reflective structure arranged at the holder provided at the furnace opening flange and (Continued)

along an inner wall of the second reaction tube at a lower portion of the second reaction tube in the first space.

16 Claims, 8 Drawing Sheets

(51) Int. Cl.
    *C23C 16/458* (2006.01)
    *H01L 21/31* (2006.01)
    *H01L 21/67* (2006.01)
    *H01L 21/677* (2006.01)

(52) U.S. Cl.
    CPC .. *H01L 21/67109* (2013.01); *H01L 21/67115* (2013.01); *H01L 21/67757* (2013.01); *H01L 21/31* (2013.01)

(58) Field of Classification Search
    CPC . C23C 16/52; C23C 16/0209; C23C 16/4401; C23C 16/4405; C23C 16/45578; C23C 14/22; H01L 21/67109; H01L 21/67115; H01L 21/67103; H01L 21/324; H01L 21/67757; H01L 21/67126; H01L 21/67098; H05B 3/02; H05B 3/54

See application file for complete search history.

(56) References Cited

U.S. PATENT DOCUMENTS

| 2012/0067869 | A1  | 3/2012 | Shirako et al. |
| 2016/0079083 | A1* | 3/2016 | Kusunoki ......... H01L 21/67109 438/758 |
| 2017/0218507 | A1* | 8/2017 | Kim ..................... C23C 16/46 |
| 2019/0024232 | A1* | 1/2019 | Kosugi ............. H01L 21/67109 |

OTHER PUBLICATIONS

Request for the Submission of an Opinion with English translation in Korean Application No. 10-2022-7020834, dated Apr. 11, 2024, 7 pages.

* cited by examiner

SUBSTRATE PROCESSING APPARATUS, HEAT INSULATOR ASSEMBLY AND METHOD OF MANUFACTURING SEMICONDUCTOR DEVICE

CROSS REFERENCE TO RELATED APPLICATIONS

This application is a continuation of International Application No. PCT/JP2021/009625, filed on Mar. 10, 2021, which claims priority under 35 U.S.C. § 119 to Application No. JP 2020-050144 filed on Mar. 19, 2020, the entire contents of which are hereby incorporated by reference.

TECHNICAL FIELD

The present disclosure relates to a substrate processing apparatus, a heat insulator assembly and a method of manufacturing a semiconductor device.

BACKGROUND

As an example of a substrate processing apparatus, a semiconductor manufacturing apparatus may be used, and as an example of the semiconductor manufacturing apparatus, a vertical type semiconductor manufacturing apparatus may be used. In the vertical type semiconductor manufacturing apparatus, for example, a processing of a substrate such as forming a film on the substrate may be performed by loading (transferring) a plurality of substrates including the substrate into a process chamber provided inside a reaction tube of the vertical type semiconductor manufacturing apparatus while the plurality of substrates are supported by a substrate retainer in a multistage manner and supplying a process gas into the process chamber while the plurality of substrates are being heated.

However, in such a vertical type semiconductor manufacturing apparatus, since a heat of the process chamber may leak out of the process chamber, a processing quality of the substrate may be deteriorated.

SUMMARY

According to the present disclosure, there is provided a technique (or configuration) capable of suppressing a decrease in a temperature of a process chamber.

According to one or more embodiments of the present disclosure, there is provided a technique (or configuration) related to a substrate processing apparatus including: a substrate retainer provided with a heat insulating region at a lower portion thereof, wherein a heat insulator is provided in the heat insulating region; a first reaction tube with open upper and lower ends and in which the substrate retainer is accommodated; a second reaction tube with a closed upper end and an open lower end; a furnace opening flange provided with a holder in a first space between the first reaction tube and the second reaction tube; a heater provided so as to cover the second reaction tube and configured to heat a substrate arranged in the substrate retainer in the first reaction tube; a first highly reflective structure whose infrared reflectance is higher than that of the heat insulator and provided in the heat insulating region; and a second highly reflective structure whose infrared reflectance is higher than that of the heat insulator and arranged at the holder provided at the furnace opening flange so as to be provided along an inner wall of the second reaction tube at a lower portion of the second reaction tube in the first space.

DETAILED DESCRIPTION

Embodiments

Figure 1:
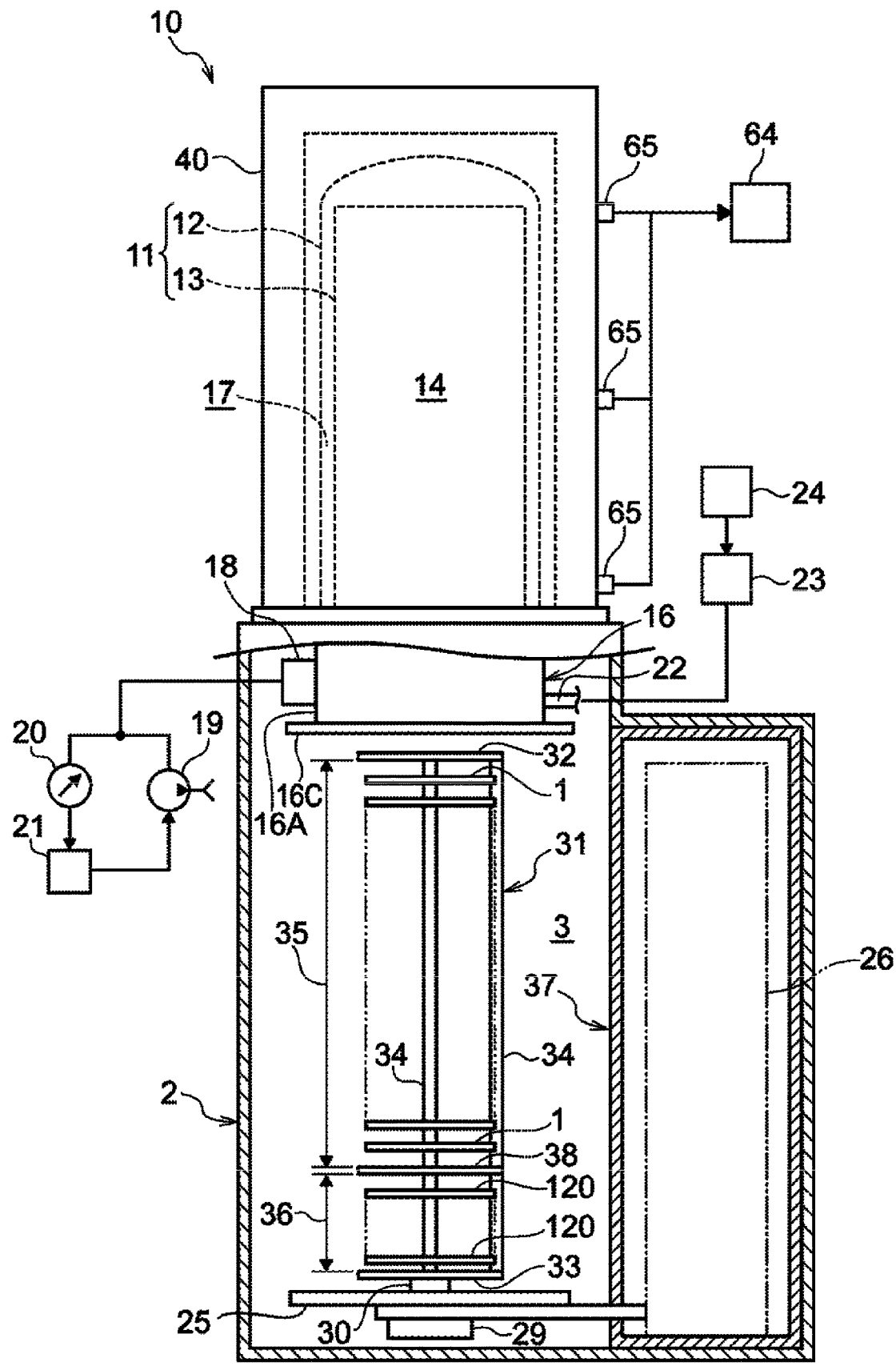
FIG. 1 is a diagram schematically illustrating a cross-section of a part of a substrate processing apparatus according to one or more embodiments of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

As shown in FIG. 1, for example, a substrate processing apparatus 10 according to the embodiments of the present disclosure is configured as a batch vertical type substrate processing apparatus configured to perform a film-forming process of a method of manufacturing an IC (integrated circuit).

Figure 2:
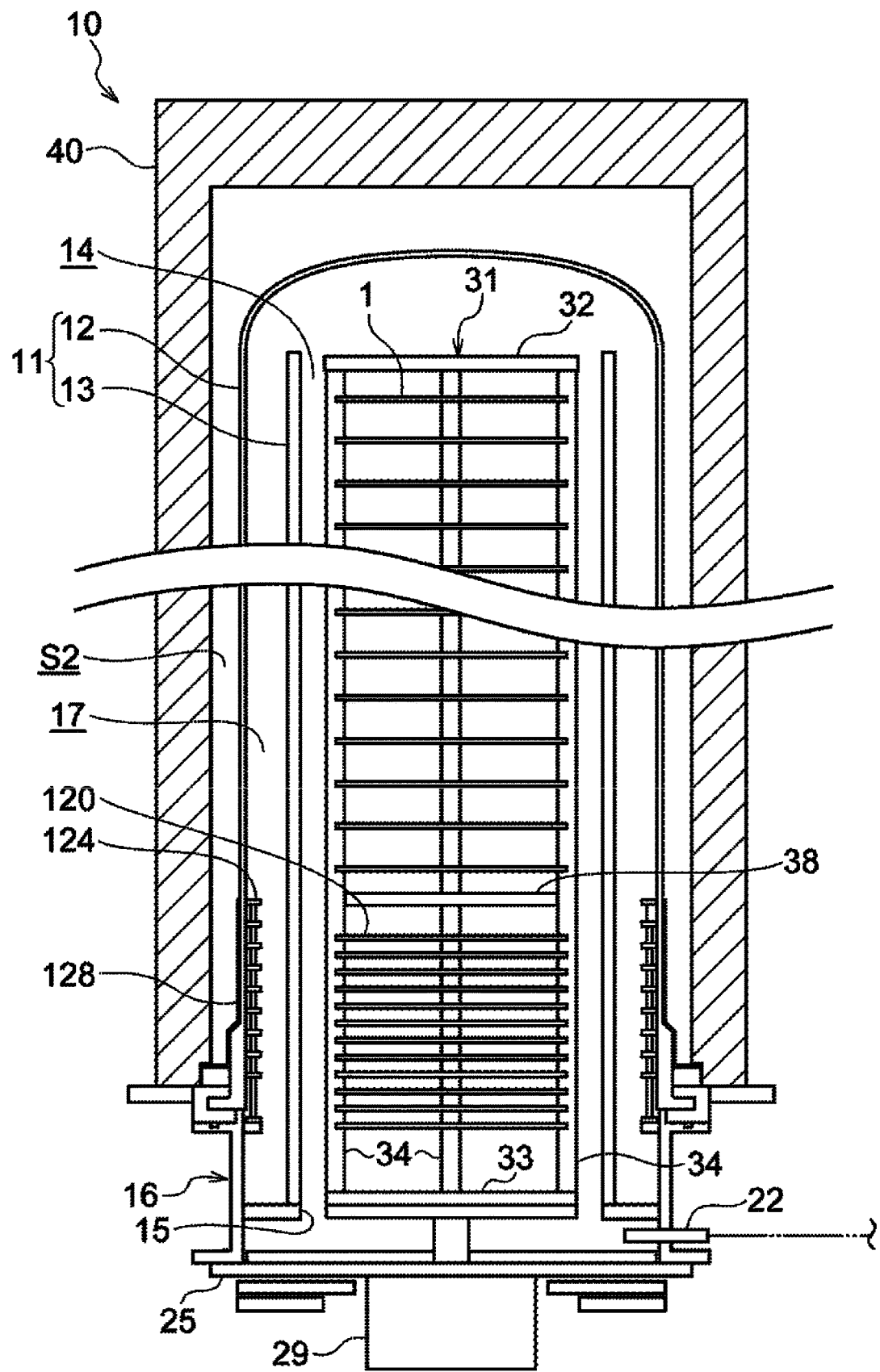
FIG. 2 is a diagram schematically illustrating a cross-section of a front portion of the substrate processing apparatus according to the embodiments of the present disclosure.

As shown in FIGS. 1 and 2, the substrate processing apparatus 10 includes a process tube 11 serving as a reaction tube of a vertical type supported therein, and the process tube 11 includes an outer tube 12 serving as a second reaction tube and an inner tube 13 serving as a first reaction tube, which are arranged concentrically.

For example, the outer tube 12 is made of quartz ($SiO_2$). The outer tube 12 is formed as a single body of a cylinder shape with a closed upper end and an open lower end. A process chamber 14 is provided inside the outer tube 12 and a manifold 16 serving as a furnace opening flange described later.

For example, the inner tube 13 is made of quartz ($SiO_2$). The inner tube 13 is of a cylinder shape with open upper and lower ends. The inner tube 13 is arranged in the process chamber 14, and a hollow cylindrical portion of the inner tube 13 is configured as a process flow path through which a boat 31 serving as a substrate retainer is transferred (loaded or unloaded). By a gap between the outer tube 12 and the inner tube 13, an exhaust flow path 17 serving as a first space is provided. The exhaust flow path 17 is of a circular ring shape whose transverse cross-section has a constant width. A lower end opening of the inner tube 13 constitutes a furnace opening space serving as a furnace opening 15 through which, in particular, the boat 31 is transferred (loaded or unloaded). Further, the exhaust flow path 17 and the furnace opening 15 also serve as a part of the process chamber 14.

Further, the outer tube 12 and the inner tube 13 are not limited to quartz ($SiO_2$), and may be made of a material whose heat resistance is high such as silicon carbide (SiC) and a composite material of quartz and silicon carbide.

As will be described later, the boat 31 loaded into the inner tube 13 is configured to accommodate (hold or support) a plurality of substrates including a substrate (hereinafter also referred to as a "wafer") 1 arranged (or aligned) in a vertical direction in a multistage manner. Hereafter, the plurality of substrates including the substrate 1 may also be simply referred to as substrates 1. Therefore, an inner diameter of the inner tube 13 is set to be greater than a maximum outer diameter (for example, 300 mm) of the substrate 1 to be processed.

The manifold 16 serving as the furnace opening flange is provided at a lower end portion between the outer tube 12 and the inner tube 13. The manifold 16 is substantially of a cylinder shape. For example, for the replacement of the outer tube 12 and the inner tube 13, the manifold 16 is detachably attached to each of the outer tube 12 and the inner tube 13. By supporting the manifold 16 on a housing 2 of the substrate processing apparatus 10, the process tube 11 is vertically provided on the manifold 16. The inner tube 13 is arranged on a support of a disk shape protruding from the manifold 16.

As shown in FIG. 1, one end of an exhaust pipe 18 is connected to a cylindrical portion 16A of the manifold 16, and the exhaust pipe 18 communicates with a lowermost end portion of the exhaust flow path 17.

An exhauster (which is an exhaust apparatus) 19 controlled by a pressure controller 21 is connected to the other end of the exhaust pipe 18, and a pressure sensor 20 is connected to an intermediate location of the exhaust pipe 18. The pressure controller 21 is configured to feedback-control the exhauster 19 based on measured results by the pressure sensor 20.

Further, a gas introduction pipe 22 is provided at the cylindrical portion 16A of the manifold 16 so as to communicate with the furnace opening 15. A source gas supplier (which is a source gas supply apparatus), a reactive gas supplier (which is a reactive gas supply apparatus) and an inert gas supplier (which is an inert gas supply apparatus) are connected to the gas introduction pipe 22. Hereinafter, the source gas supplier, the reactive gas supplier and the inert gas supplier are collectively or individually referred to simply as a gas supplier (which is a gas supply apparatus) 23. The gas supplier 23 is configured to be controlled by a gas flow rate controller 24. A gas introduced into the furnace opening 15 through the gas introduction pipe 22 flows through the process flow path to the exhaust flow path 17 (that is, flows through the process chamber 14), and is exhausted through the exhaust pipe 18.

A seal cap 25 serving as a lid capable of airtightly sealing a lower end opening of the manifold 16 is provided vertically under the manifold 16. The seal cap 25 is in contact with the lower end of the manifold 16. The seal cap 25 is of a disk shape, and a diameter of the seal cap 25 is substantially equal to an outer diameter of the manifold 16. The seal cap 25 is configured to be elevated or lowered vertically by a boat elevator 26 protected by a boat cover 37 provided in a transfer chamber 3 of the housing 2. The boat elevator 26 may be constituted by components such as a motor-driven feed screw shaft device and a bellows, which are not shown.

A rotating shaft 30 is arranged on a center line of the seal cap 25 so as to be rotatably supported. The rotating shaft 30 is configured to be rotationally driven by a boat rotator 29 constituted by components such as a motor. The boat 31 is vertically supported at an upper end of the rotating shaft 30.

Configuration of Boat

As shown in FIG. 2, for example, the boat 31 includes a pair of end plates (that is, an upper end plate and a lower end plate) 32 and 33, an end plate 38 provided between the end plate 32 and the end plate 33, and three support columns 34 provided vertically therebetween. A plurality of support recesses (not shown) are engraved at each of the three support columns 34 at equal intervals in a lengthwise direction of each of the three support columns 34.

The support recesses located at the same stage of each of the three support columns 34 are open to face one another. By inserting the substrates 1 into the support recesses located at the same stage of each of the three support columns 34 between the end plate 32 and the end plate 38, the boat 31 supports (or hold) the substrates 1 while the substrates 1 are horizontally oriented with their centers aligned with one another.

Further, in the boat 31, a heat insulator is provided between the support recesses located at the same stage of each of the three support columns 34 between the end plate 38 and the end plate 33. As the heat insulator, a heat insulating plate 120 with a reflective structure serving as a first highly reflective structure may be inserted, or a plurality of heat insulating plates including the heat insulating plate 120 with the reflective structure may be provided while the plurality of heat insulating plates are horizontally oriented with their centers aligned with one another. Hereafter, the plurality of heat insulating plates including the heat insulating plate 120 may also be simply referred to as heat insulating plates 120.

As shown in FIG. 1, the boat 31 is configured such that a substrate processing region 35 between the end plate 32 and the end plate 38 where the substrates 1 are accommodated and a heat insulating plate region (hereinafter, also referred to as a heat insulating region) 36 between the end plate 38 and the end plate 33 where the heat insulating plates 120 are accommodated are distinguishably provided, and the heat insulating region 36 is arranged below the substrate processing region 35. For example, in the heat insulating region 36, the heat insulating plates 120 are provided between the end plate 38 and the lower end plate 33 at regular intervals.

Heater

Figure 3A:
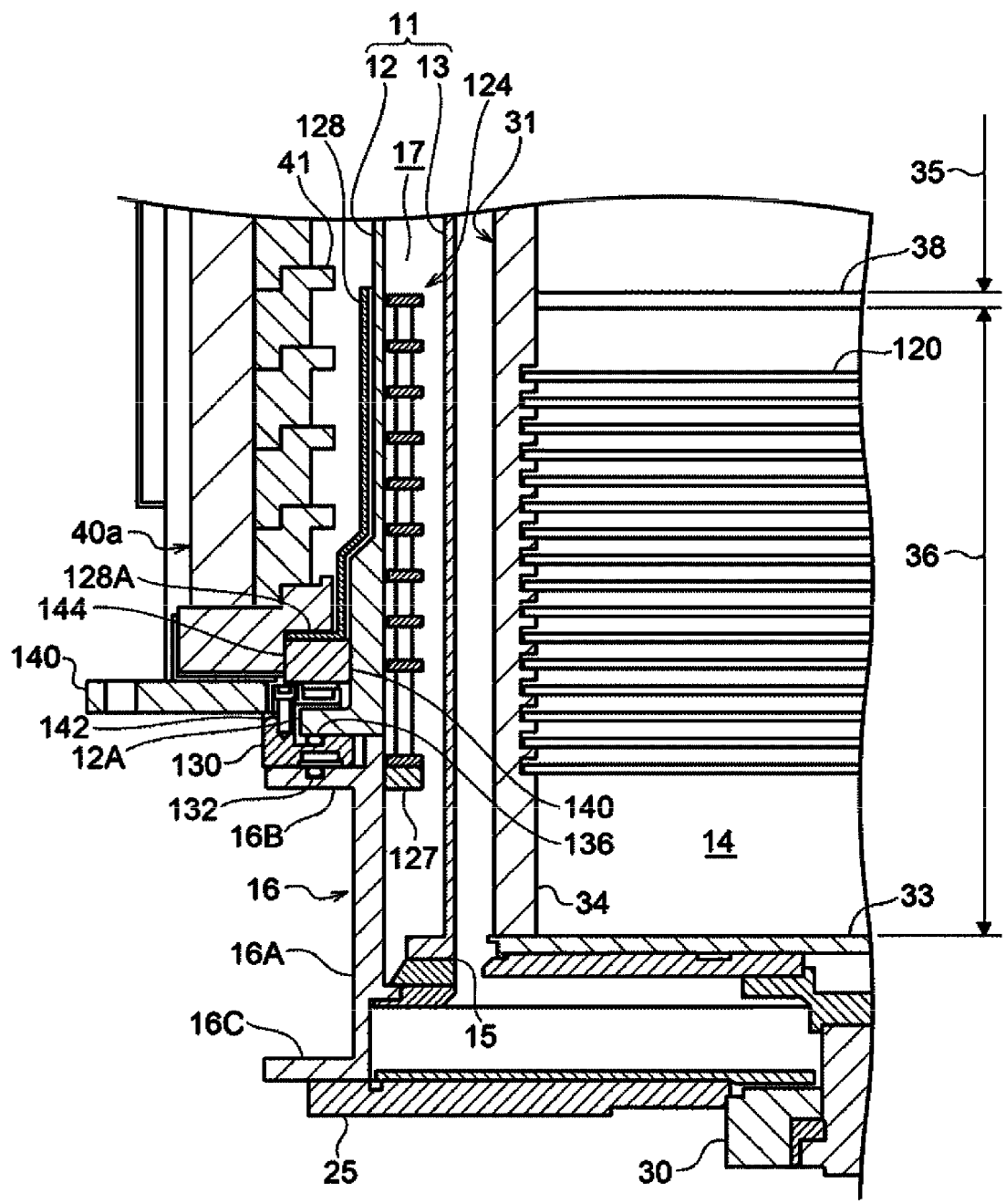
FIG. 3A is a diagram schematically illustrating a cross-section of a periphery of a heat insulating region of a substrate retainer according to the embodiments of the present disclosure.

As shown in FIGS. 1, 2, and 3A, a heater 40 serving as a heating structure and constituted by concentric ring structures is arranged at an outside of the process tube 11 and is supported by the housing 2. Thereby, the heater 40 is configured to heat the substrate 1 in the substrate processing region 35 supported by the boat 31 inserted into the inner tube 13. For example, the heater 40 is made of stainless steel (SUS), and is of a tube shape with a closed upper end and an open lower end, preferably, a cylinder shape. A heat insulator 40a and a heat insulator 41 are arranged inside the heater 40, and an electric heater (not shown) is incorporated in the heat insulator 41.

Hereinafter, a highly reflective structure will be described in detail with reference to FIGS. 3 through 7.

Figure 3B:
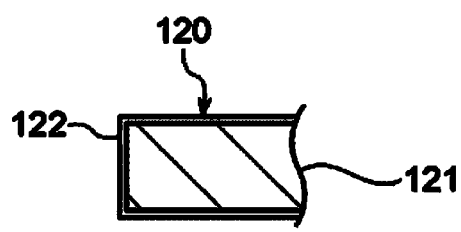
FIG. 3B is a diagram schematically illustrating a cross-section of a heat insulating plate with a reflective structure.

Heat Insulating Plate with Reflective Structure: First Highly Reflective Structure As shown in FIG. 3B, for example, the heat insulating plate 120 with the reflective structure serving as the first highly reflective structure is configured by a disk 121 made of opaque quartz serving as a heat insulator, and a first highly reflective structure 122 whose infrared reflectance is higher than that of the opaque quartz is formed on a surface of the disk 121 made of the opaque quartz. The first highly reflective structure 122 is formed in a film shape whose thickness is thinner than that of the disk 121. Further, the disk 121 made of the opaque quartz serves as an example of a heat insulating plate of the present disclosure.

Alternatively, the heat insulating plate 120 with the reflective structure itself may be made of a material whose heat insulating property is equal to or higher than that of the opaque quartz and whose infrared reflectance is higher than that of the opaque quartz.

By arranging the heat insulating plate 120 with the reflective structure in the heat insulating plate region 36 of the boat 31 as described above, it is possible to suppress a heat leakage from the furnace opening 15 as compared with a case in which the heat insulator alone is arranged.

Reflecting Plate: Second Highly Reflective Structure

As shown in FIG. 3A, a reflecting plate 124 whose infrared reflectance is higher than those of the outer tube 12 and the inner tube 13 is arranged in the exhaust flow path 17 between the outer tube 12 and the inner tube 13. Specifically, at an upper end of an inner peripheral surface of the manifold 16, a plurality of blocks 127 serving as a holder are provided along a circumferential direction, and the reflecting plate 124 serving as a second highly reflective structure is arranged on the blocks 127 such that the reflecting plate 124 is provided at a lower portion of the outer tube 12 and on an inner wall of the outer tube 12.

Figure 4A:
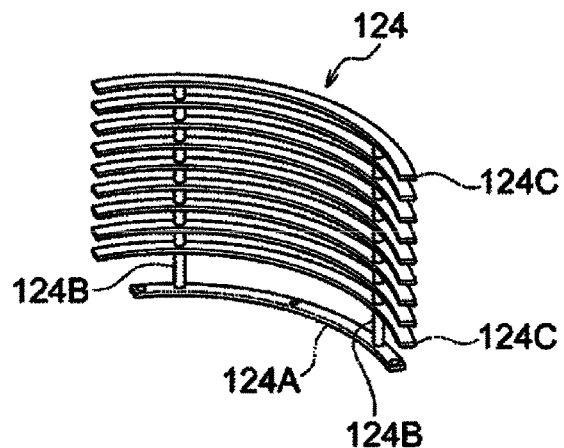
FIG. 4A is a diagram schematically illustrating a reflecting plate according to the embodiments of the present disclosure.
Figure 4B:
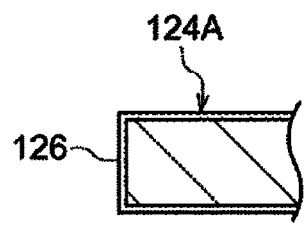
FIG. 4B is a diagram schematically illustrating a cross-section of a support base of the reflecting plate.

As shown in FIG. 4A, the reflecting plate 124 includes a support base 124A of an arc shape, and a plurality of support columns (for example, two support columns according to the present embodiments) 124B are vertically provided on the support base 124A. A plurality of reflecting structures 124C of an arc shape are supported on the support columns 124B at regular intervals in the vertical direction.

For example, the support base 124A, the support columns 124B and the reflecting structures 124C may be made of a material such as opaque quartz. Further, a second highly reflective structure 126 whose infrared reflectance is higher than that of a material (according to the present embodiments, for example, the opaque quartz) constituting the support base 124A, the support columns 124B and the reflecting structures 124C is formed on surfaces of the support base 124A, the support columns 124B and the reflecting structures 124C. The second highly reflective structure 126 is formed in a film shape (see FIG. 4B). As a material of the second highly reflective structure 126, the same material as the first highly reflective structure 122 of the heat insulating plate 120 with the reflective structure may be used. Further, a thickness of the film of the second highly reflective structure 126 is thinner than that of the disk 121 of the heat insulating plate 120 with the reflective structure.

Alternatively, the support base 124A, the support columns 124B and the reflecting structures 124C itself may be made of a material whose heat insulating property is equal to or higher than that of the opaque quartz and whose infrared reflectance is higher than that of the opaque quartz.

Figure 5:
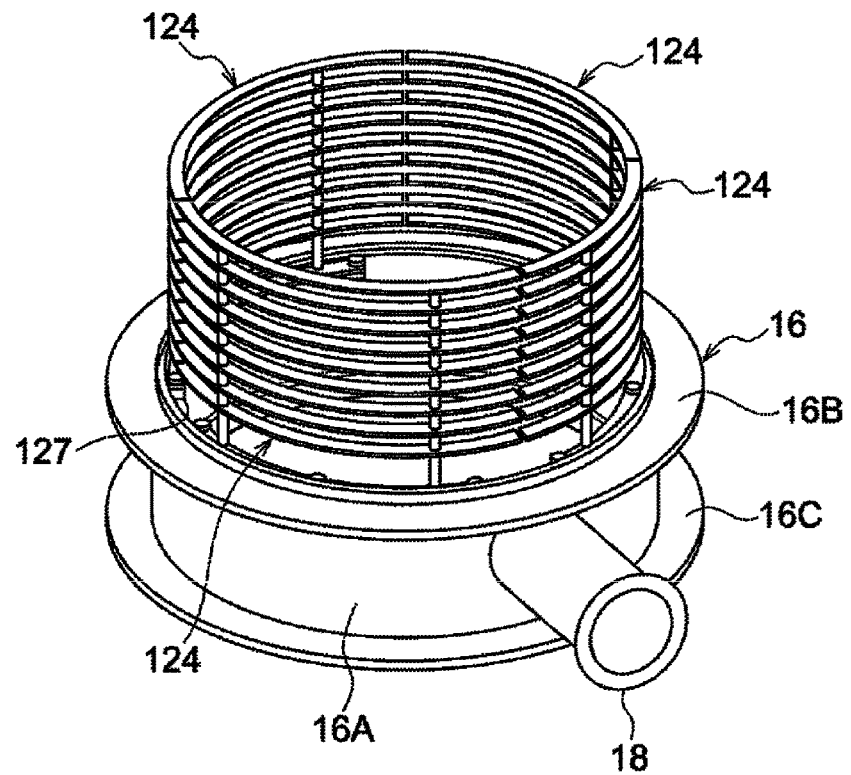
FIG. 5 is a diagram schematically illustrating the reflecting plate supported by a manifold.

As shown in FIG. 5, the reflecting plate 124 mounted on the blocks 127 is fixed by a component such as a bolt. In addition, a plurality of reflecting plates including the reflecting plate 124 of an arc shape are arranged inside a first space S1 so as to surround the inner tube 13. Hereinafter, the plurality of reflecting plates including the reflecting plate 124 may also be simply referred to as reflecting plates 124.

As shown in FIG. 3A, when the boat 31 is arranged at a predetermined position (that is, a position at which the substrate 1 is processed) in the inner tube 13, the reflecting plate 124 is arranged at a position facing the heat insulating plate region 36 of the boat 31 and arranged below the end plate 38.

Further, gaps through which the gas passes are provided between the reflecting plate 124 and the outer tube 12 and between the reflecting plate 124 and the inner tube 13 so as not to block the exhaust flow path 17.

Third Highly Reflective Structure

Figure 6:
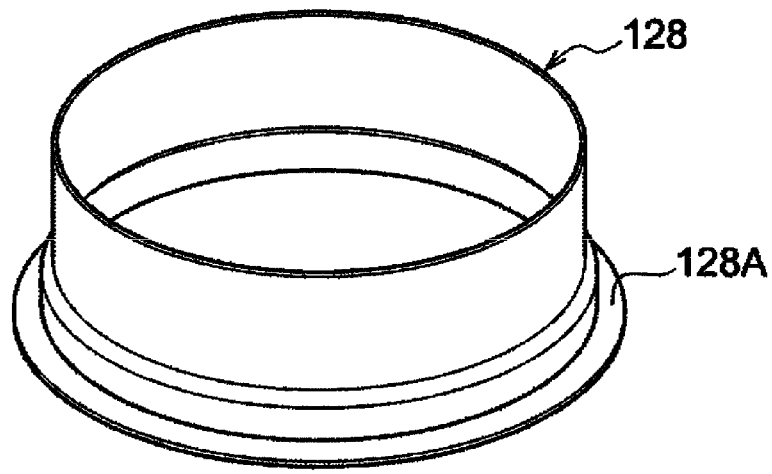
FIG. 6 is a diagram schematically illustrating a third highly reflective structure according to the embodiments of the present disclosure.

As shown in FIG. 3A, inside a second space S2 between the heater 40 and the outer tube 12, a third highly reflective structure 128 of a cylinder shape shown in FIG. 6 is arranged along an outer peripheral surface of the outer tube 12. The third highly reflective structure 128 according to the present embodiments is of a cylinder shape in accordance with an outer surface shape of the outer tube 12, and an outer flange 128A extending radially outward is provided at a lower end of the third highly reflective structure 128.

As shown in FIG. 3A, the manifold 16 located below the outer tube 12 includes the cylindrical portion 16A. An upper flange 16B extending radially outward is integrally formed as a single body at the upper end of the cylindrical portion 16A, and a lower flange 16C extending radially outward is integrally formed as a single body at the lower end of the cylindrical portion 16A.

A cooling ring 130 of an annular shape provided with a flow path through which cooling water flows is integrally attached to an outside of an upper surface of the upper flange 16B. A groove into which an O-ring 132 made of an elastic structure capable of sealing a gap between the upper flange 16B and the cooling ring 130 is fitted is provided on the upper surface of the upper flange 16B, and a groove into which an O-ring 136 made of an elastic structure capable of sealing a gap between the cooling ring 130 and an outer flange 12A of the outer tube 12 is fitted is provided on an upper surface of the cooling ring 130. The second space S2 is sealed by the O-rings 132 and 136. Further, by supplying the cooling water through the cooling ring 130, it is possible to cool the periphery of the cooling ring 130, the O-ring 132 and the O-ring 136, and it is also possible to suppress the deterioration or damage in the O-ring 132 and the O-ring 136 caused by the heat. Further, by the cooling ring 130, it is possible to reduce the heat transfer from the outer flange 12A of the outer tube 12 to the upper flange 16B.

A fixing ring 140 is arranged above the outer flange 12A of the outer tube 12, and the outer flange 12A is sandwiched (or located) between the fixing ring 140 and the cooling ring 130. Further, the fixing ring 140 is fixed to the cooling ring 130 with a bolt 142.

The third highly reflective structure 128 is placed above the fixing ring 140 via a ring 144. For an example, the third highly reflective structure 128 may be made of a material whose infrared reflectance is higher than that of a material (according to the present embodiments, for example, the opaque quartz) constituting the outer tube 12.

Figure 7:
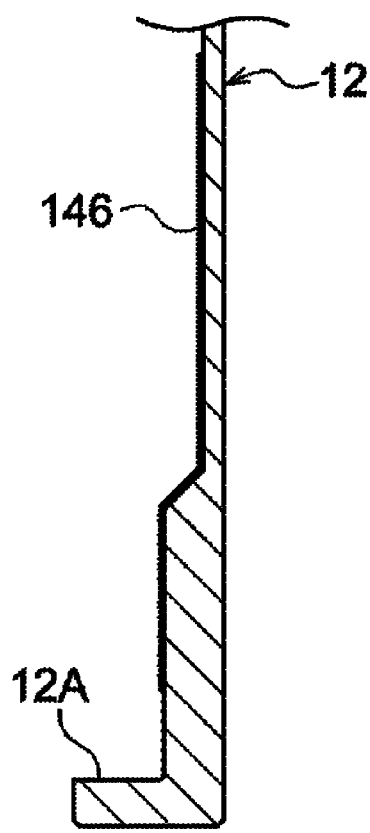
FIG. 7 is a diagram schematically illustrating a cross-section of a third highly reflective structure according to another embodiment of the present disclosure.

Further, instead of arranging the third highly reflective structure 128 of a cylinder shape at an outside of the outer tube 12, as shown in FIG. 7, a reflective film 146 made of a material whose infrared reflectance is higher than that of the material constituting the outer tube 12 may be provided at the outer peripheral surface of the outer tube 12. Further, a thickness of the reflective film 146 is preferably thinner than that of the disk 121 of the heat insulating plate 120 with the reflective structure.

As a material of the reflective film 146, the same material used for the heat insulating plate 120 with the reflective structure or the reflecting plate 124 may be used.

As shown in FIG. 3A, when the boat 31 is arranged at the predetermined position in the inner tube 13 (that is, when the substrate 1 is processed), the reflecting plate 124 and the third highly reflective structure 128 are arranged at positions facing the heat insulating plate region 36 of the boat 31 and arranged below the end plate 38. In other words, heights of the reflecting plate 124 and the third highly reflective structure 128 are set such that the reflecting plate 124 and the third highly reflective structure 128 do not face a space between the heat insulator 41 and the substrate 1 supported by the boat 31, that is, do not face the substrate processing region 35.

According to the present embodiments, as the material of each highly reflective structure (that is, the first highly reflective structure 122, the second highly reflective structure 126 and the third highly reflective structure 128), for example, a material such as gold (Au whose infrared reflectance is 97%), silver (Ag whose infrared reflectance is 95%) and platinum (Pt whose infrared reflectance is 90%) may be used. However, a material other than the material such as gold, silver and platinum may be used. For reference, the infrared reflectance of quartz is 50%. Further, the term "infrared reflectance" in the present specification refers to, for example, the reflectance of an infrared light whose wavelength is around 3,000 nm (for example, a wavelength of 2,800 nm or more and 3,200 nm or less). For example, when a temperature of the infrared light is 600° C., a peak value of the radiation wavelength is 3,200 nm, and when the temperature of the infrared light is 800° C., the peak value of the radiation wavelength is 2,800 nm.

According to the present embodiments, the infrared reflectance of each of the first highly reflective structure 122 (that is, the heat insulating plate 120 with the reflective structure), the second highly reflective structure 126 (that is, the reflecting plate 124) and the third highly reflective structure 128 is preferably set to be 80% or more. However, even when the infrared reflectance of each highly reflective structure is less than 80%, as long as the infrared reflectance of each highly reflective structure is higher than 50%, it is possible to obtain the infrared reflection effect.

The infrared reflectance of each of the first highly reflective structure 122 (that is, the heat insulating plate 120 with the reflective structure), the second highly reflective structure 126 (that is, the reflecting plate 124) and the third highly reflective structure 128 may be substantially the same, or the infrared reflectance of at least one among the highly reflective structures may be different from the others among the highly reflective structures. That is, as long as the infrared reflectance of each highly reflective structure is higher than at least 50%, it is possible to obtain the infrared reflection effect.

Further, similar to the third highly reflective structure 128, the reflecting plate 124 may be configured by forming the second highly reflective structure 126 in a film shape on a surface of the outer tube 12. Further, an uppermost end of the third highly reflective structure 128 may be located higher than an uppermost end of the reflecting plate 124.

According to the present embodiments, the heat insulating plate 120 with the reflective structure, the reflecting plate 124 and the third highly reflective structure 128 are arranged at positions facing the heat insulating plate region 36. Thereby, it is possible to suppress the heat leakage from the furnace opening 15, and it is also possible to suppress a heat leakage from the cooling ring 130 of an annular shape in which the flow path through which the cooling water flows is provided.

Controller

Figure 8:
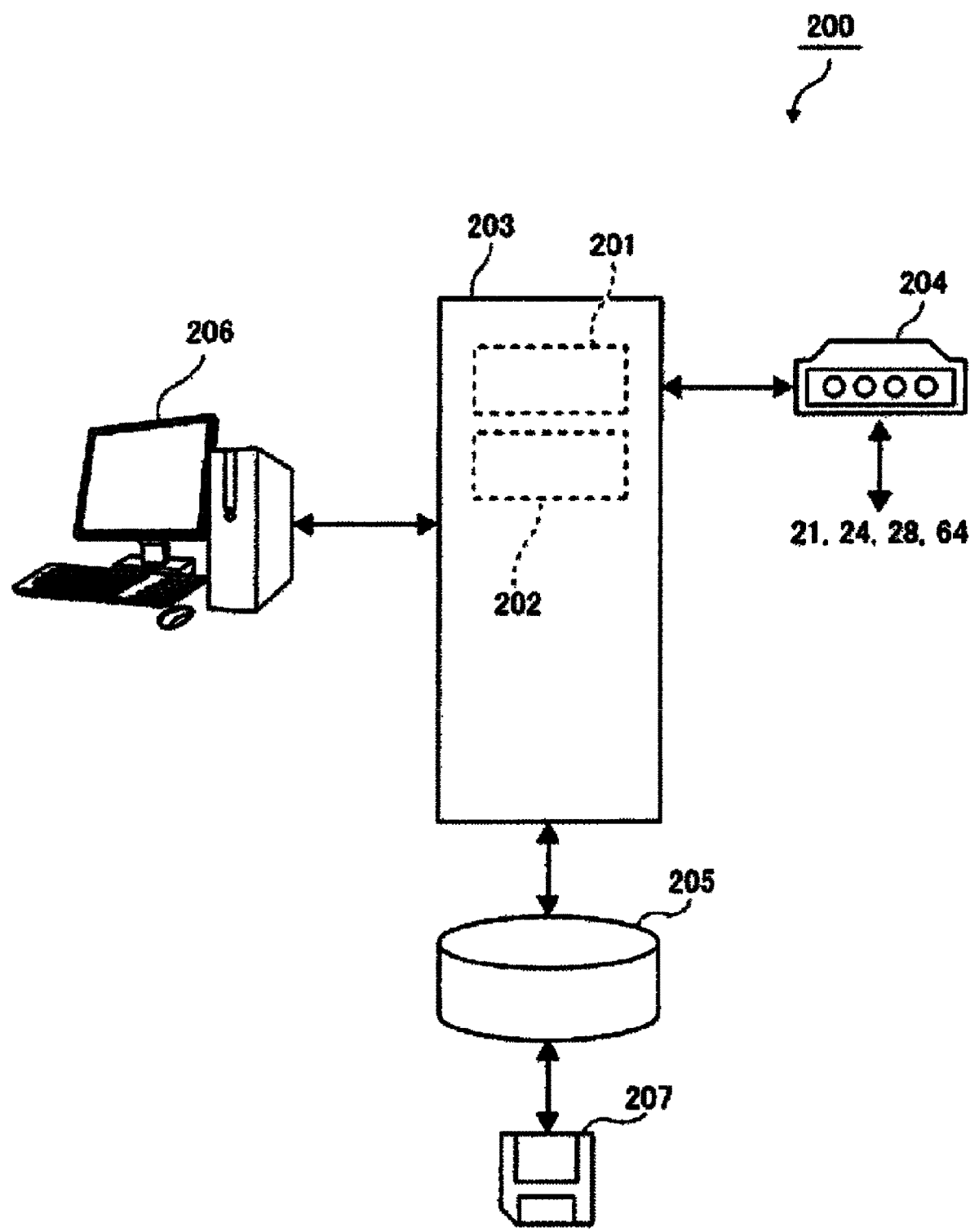
FIG. 8 is a diagram schematically illustrating a hardware configuration of a controller of the substrate processing apparatus according to the embodiments of the present disclosure.

As shown in FIG. 8, the substrate processing apparatus 10 according to the present embodiments includes a controller 200. The controller 200, which is a control computer serving as a control structure, may include: a computer main structure 203 including components such as a CPU (Central Processing Unit) 201 and a memory 202; a communication interface 204 serving as a communication structure; a memory 205 serving as a memory structure; and a display/input device 206 serving as an operation structure. That is, the controller 200 includes components constituting a general-purpose computer.

The CPU 201 constitutes a backbone of the controller 200. The CPU 201 is configured to execute a control program stored in the memory 205 and a recipe (for example, a process recipe) stored in the memory 205, in accordance with an instruction from the display/input device 206. For example, the process recipe may include a processing constituted by a step S1 through a step S6 shown in FIG. 9 described later. For example, the process recipe may include a processing constituted by the step S1 through a step S9 shown in FIG. 10 described later.

Further, the memory 202 serving as a temporary memory structure may be constituted by components such as a flash memory and a RANI (Random Access Memory). In particular, the RAM may function as a memory area (work area) of the CPU 201.

The communication interface 204 is electrically connected to the pressure controller 21, the gas flow rate controller 24, an operation controller 28 and a temperature controller 64. The pressure controller 21, the gas flow rate controller 24, the operation controller 28 and the temperature controller 64 may be collectively or individually referred to simply as a sub-controller. The controller 200 can exchange data on operations of components with the sub-controller through the communication interface 204. According to the present embodiments, for example, the sub-controller is constituted by a configuration including at least a main structure 203, and may be constituted by the same configuration as the controller 200.

While the embodiments of the present disclosure are described by way of an example in which the controller 200 is embodied by the control computer, the controller 200 is not limited thereto. For example, the controller 200 may be embodied by a general computer system. For example, the processing described above may be performed by installing in the general computer a program for executing the processing described above from an external recording medium 207 such as a USB which stores the program. For example, the communication interface 204 such as a communication line, a communication network and a communication system may be used to provide the program. In such a case, for example, the program may be posted on a bulletin board on the communication network, and the program may be superimposed on a carrier wave and provided via a network. Then, the program provided as described above may be executed to perform the processing described above under a control of an OS (operating system) just like any other application programs.

Film-forming Process

Subsequently, an exemplary sequence of a process of forming a film on a substrate by using the substrate processing apparatus 10 described above (hereinafter, also referred to as a "substrate processing" or a "film-forming process"), which is a part of a manufacturing process of a semiconductor device will be described.

In the film-forming process according to the present embodiments, the film is formed on the substrate 1 by simultaneously performing, for at least a certain period of time, a step of supplying a source gas with respect to the substrate 1 in the process chamber 14 and a step of supplying a reactive gas with respect to the substrate 1 in the process chamber 14. Alternatively, the film may be formed on the substrate 1 by performing a cycle a predetermined number of times (once or more). The cycle may include: a step of supplying the source gas or the reactive gas with respect to the substrate 1 in the process chamber 14 and a step of removing an unreacted residual gas from the process chamber 14.

In addition, in the present specification, the term "substrate" may be used with substantially the same meaning as the term "wafer".

In the film-forming process according to the present embodiments, the film is formed on the substrate 1 by simultaneously performing the step of supplying the source gas with respect to the substrate 1 in the process chamber 14 and the step of supplying the reactive gas with respect to the substrate 1 in the process chamber 14. Hereafter, a case in which the source gas and the reactive gas are simultaneously supplied during the entire processing period will be described below.

Substrate Loading Step S1

By operating the boat elevator 26 by the operation controller 28, the boat 31 accommodating the substrates 1 and the heat insulating plate 120 with the reflective structure is transferred into the process tube 11, and transferred (or loaded) into the process chamber 14 (boat loading). When the boat 31 is loaded into the process chamber 14, the seal cap 25 airtightly seals (or closes) the process chamber 14 via an O-ring (not shown).

Further, by operating the boat elevator 26 by a transfer device (not shown) and a transfer device elevator (not shown) by the operation controller 28, the substrates 1 are transferred (or charged) into the substrate processing region 35 of the boat 31 (substrate charging). In addition, the heat insulating plates 120 are accommodated (or charged) in the heat insulating plate region 36 of the boat 31 in advance.

Pressure and Temperature Adjusting Step S2

The pressure controller 21 controls the exhauster 19 such that a pressure of the process chamber 14 reaches and is maintained at a predetermined pressure (vacuum level). When the pressure controller 21 controls the exhauster 19, the pressure of the process chamber 14 is measured by the pressure sensor 20, and the exhauster 19 is feedback-controlled based on pressure information measured by the pressure sensor 20. The exhauster 19 is continuously operated at least until a processing of the substrate 1 is completed.

Further, the heater 40 heats the process chamber 14 until a temperature of the substrate 1 inside the process chamber 14 reaches and is maintained at a predetermined temperature. When the heater 40 heats the process chamber 14, a state of electric conduction to the electric heater of the heater 40 is feedback-controlled by the temperature controller 64 based on temperature information detected by a thermocouple 65 installed at the heater 40 such that a predetermined temperature distribution of the process chamber 14 can be obtained. The heater 40 continuously heats the process chamber 14 at least until the processing of the substrate 1 is completed. In the step S2, a process temperature is maintained at a temperature within a temperature range from 600° C. to 800° C., preferably, from 650° C. to 700° C.

Further, the boat 31 and the substrate 1 are rotated by the motor of the boat rotator 29. Specifically, the operation controller 28 rotates the motor of the boat rotator 29 to rotate the boat 31. As the boat 31 is rotated, the substrate 1 is thereby rotated. The motor of the boat rotator 29 continuously rotates the boat 31 and the substrate 1 at least until the processing of the substrate 1 is completed.

Film-forming Step S3

When the temperature of the process chamber 14 is stabilized at a pre-set process temperature, a supply of the source gas with respect to the substrate 1 in the process chamber 14 and a supply of the reactive gas with respect to the substrate 1 in the process chamber 14 are performed simultaneously.

In the present step, a mixed gas of the source gas and the reactive gas whose flow rates are respectively adjusted by the gas flow rate controller 24 is introduced into the process chamber 14 through the gas introduction pipe 22. Then, the mixed gas is thermally decomposed in a gaseous atmosphere of the process chamber 14 to form the film on the substrate 1. An unreacted mixed gas flows through the exhaust flow path 17 and is exhausted through the exhaust pipe 18. When exhausting the unreacted mixed gas, $N_2$ gas may simultaneously be supplied into the gas introduction pipe 22. Alternatively, a gas introduction pipe for the source gas and a gas introduction pipe for the reactive gas may be provided separately, and the source gas and the reactive gas may be mixed in the process chamber 14 to form the film on the substrate 1.

Purge Gas Supply Step S4

After the film is formed on the substrate 1, the supply of the source gas and the supply of the reactive gas are stopped. Further, in the step S4, the exhauster 19 vacuum-exhausts the process chamber 14 to discharge a residual gas in the process chamber 14 (such as the source gas, the reactive gas and the mixed gas) which did not react or which did contribute to the formation of the film from the process chamber 14. When discharging the residual gas, the $N_2$ gas may be supplied into the process chamber 14. The $N_2$ gas acts as a purge gas, which improves the efficiency of discharging (or removing) the residual gas in the process chamber 14 from the process chamber 14.

Performing a Predetermined Number of Times

Although not shown, the film of a predetermined thickness may be formed on the substrate 1 by performing a cycle in which the steps described above are performed non-simultaneously a predetermined number of times (n times).

Purge and Returning to Atmospheric Pressure Step S5

After the film-forming step S3 is completed, the $N_2$ gas is supplied into the process chamber 14 through the gas introduction pipe 22, and is exhausted through the exhaust pipe 18. The $N_2$ gas acts as the purge gas. Thereby, the process chamber 14 is purged, and substances such as the residual gas in the process chamber 14 and reaction by-products are removed from the process chamber 14 (purge). Simultaneously, cooling air (not shown) serving as a cooling gas is supplied to a gas introduction path (not shown) via a check damper (not shown). The supplied cooling air is temporarily stored in a buffer (not shown) and is ejected into a space (not shown) through a plurality of opening holes (not shown) and a gas supply flow path (not shown). Then, the cooling air (not shown) ejected into the space (not shown) through the plurality of opening holes (not shown) is exhausted by an exhaust hole (not shown) and an exhaust duct (not shown). Then, an inner atmosphere of the process chamber 14 is replaced with an inert gas (substitution by the inert gas) and the pressure of the process chamber 14 is returned to a normal pressure (returning to the atmospheric pressure).

Substrate Unloading Step S6

Thereafter, by lowering the boat elevator 26 by the operation controller 28, the seal cap 25 is lowered by the boat elevator 26, and the lower end of the process tube 11 is opened. The boat 31 with the processed substrates 1 charged therein is transferred (unloaded) out of the process tube 11 through the lower end of the process tube 11 (boat unloading). Then, the processed substrates 1 are discharged from the boat 31 (substrate discharging). Thereby, the processing of the substrate 1 is completed.

Actions and Effects according to Configuration of Substrate Processing Apparatus Subsequently, actions and effects of the configuration of the substrate processing apparatus 10 according to the present embodiments will be described. According to the substrate processing apparatus 10 of the present embodiments, the heater 40 is provided so as to surround the process chamber 14, and the substrate 1 is heated from a side portion thereof. Thus, in particular, it is difficult to heat a central portion of the substrate 1 provided at a lower portion of the process chamber 14, the temperature of the substrate 1 tends to be lowered, and it takes time to elevate the temperature of the process chamber 14. Thereby, a recovery time (which is a temperature stabilization time) tends to be elongated. However, as described above, by arranging the first highly reflective structure 120 whose infrared reflectance is high in the heat insulating plate region 36, and by a heat insulating action and an infrared reflecting action, it is possible to suppress the heat leakage toward a lower portion of the substrate processing region 35 (the furnace opening 15). Thereby, it is possible to reduce a temperature decrease.

That is, according to the present embodiments, by arranging the first highly reflective structure 120 whose infrared reflectance is high in the heat insulating plate region 36, a radiant energy passing through the first highly reflective structure 120 is reduced. Thereby, it is possible to increase an amount of the heat received in the vicinity of the central portion of the substrate 1 (which is provided at the lower portion of the boat 31 and above the heat insulating plate region 36). As a result, it is possible to reduce a temperature deviation on the surface of the substrate 1 caused by a decrease in the temperature of the central portion of the substrate 1 provided at the lower portion of the process chamber 14.

Further, in the substrate processing apparatus 10 according to the present embodiments, since the reflecting plate 124 whose infrared reflectance is high is arranged in the exhaust flow path 17 between the outer tube 12 and the inner tube 13, the radiant energy passing below the substrate processing region 35 is reduced while ensuring a gas exhaust path. Therefore, as compared with a case in which the reflecting plate 124 is not arranged, it is possible to suppress the temperature decrease at the lower portion of the boat 31 and it is also possible to increase an amount of the heat received in the substrate 1 provided at the lower portion of the boat 31. Since the reflecting plate 124 also enhances the heat insulation in the vertical direction, the reflecting structures 124C are supported at regular intervals in the vertical direction.

Further, in the substrate processing apparatus 10 according to the present embodiments, the third highly reflective structure 128 whose infrared reflectance is high is arranged radially outward of the outer tube 12. The third highly reflective structure 128 suppresses the heat leakage toward a side surface direction so as to perform the heat insulation.

Further, in the substrate processing apparatus 10 according to the present embodiments, the second highly reflective structure 126 is arranged at the holder provided at the upper end of the furnace opening 15 so as to be provided on the inner wall of the outer tube 12 and provided at the lower portion of the outer tube 12 in the exhaust flow path 17 between the outer tube 12 and the inner tube 13. Further, the third highly reflective structure 128 is arranged radially outward of the outer tube 12. By the second highly reflective structure 126 and the third highly reflective structure 128, it is possible to perform the heat insulation while suppressing the heat leakage toward the cooling ring 130.

As described above, in the substrate processing apparatus 10 according to the present embodiments, by using the heat insulating plate 120 with the reflective structure including the first highly reflective structure 122, the reflecting plate 124 including the second highly reflective structure 126, and the third highly reflective structure 128, it is possible to effectively suppress the heat leakage toward the manifold 16 provided below the substrate processing region 35 and the cooling ring 130 and the heat leakage toward the side surface direction.

Further, due to a suppressing effect of the heat leakage according to the present embodiments, it is possible to reduce a heater output, and it is also possible to save the energy.

Further, for example, since each of the first highly reflective structure 122, the second highly reflective structure 126 and the third highly reflective structure 128 is thinner than the disk 121 of the heat insulating plate 120 with the reflective structure, the heat capacity of each of the highly reflective structures is small. Therefore, when the temperature is elevated, the temperature tends to be elevated easily, and when the temperature is lowered, the temperature tends to be lowered easily. As a result, it is possible to improve a temperature followability, and it is also possible to reduce the heater output.

Further, since the heat leakage toward the manifold 16 provided below the substrate processing region 35 and the cooling ring 130 and the heat leakage toward the side surface direction can be suppressed when the substrate 1 is processed, it is possible to reduce the heater output when it is stabilized, and it is also possible to save the energy.

Further, by suppressing the heat leakage toward the manifold 16, it is possible to suppress a temperature elevation of the manifold 16. Therefore, it is possible to improve a durability against the heat for a component such as the motor constituting the boat rotator 29 and a magnetic seal of the rotating shaft 30.

Experimental Example

In order to confirm the effects according to the present embodiments, a substrate processing apparatus according to an example in which the configuration of the embodiments described above is applied and a substrate processing apparatus according to a comparative example are prepared, and the heat leakage in each substrate processing apparatus is compared. In the substrate processing apparatus according to the comparative example, the reflecting plate 124 and the third highly reflective structure 128 are removed from the substrate processing apparatus 10 according to the embodiments described above, and instead of the heat insulating plate 120 with the reflective structure, a disk 121 made of quartz on which no reflective structure is provided is attached.

In the experiment, the process chamber 14 is heated by the heater 40, and the cooling water is supplied through the cooling ring 130. A temperature of the cooling water discharged through the cooling ring 130 in a state where the temperature of the process chamber 14 (for example, 800° C.) is in a constant steady state is measured.

As a result of the experiment, the temperature of the cooling water discharged from the substrate processing apparatus according to the example is lowered by about 1.5° C. with respect to the temperature of the cooling water discharged from the substrate processing apparatus according to the comparative example. When a temperature drop described above is converted into an amount of the heat, it is reduced by 300 W. Thus, it is confirmed that the suppressing effect of the heat leakage is obtained by the configuration of the present embodiments.

Further, according to a result of measuring the temperature of the process chamber 14, a result of measuring a time until the temperature of the process chamber 14 reaches a predetermined temperature by heating the process chamber 14 by the heater 40 and a result of measuring a time until the temperature of the process chamber 14 is lowered to a predetermined temperature by stopping the heating by the heater 40, it is confirmed that a temperature change in the substrate processing apparatus according to the example is faster than that in the substrate processing apparatus according to the comparative example.

Other Embodiments

The technique of the present disclosure is described in detail by way of the embodiments described above. However, the technique of the present disclosure is not limited thereto. The technique of the present disclosure may be modified in various ways without departing from the scope thereof.

For example, the embodiments described above are described by way of an example in which the process temperature is 600° C. or higher and 800° C. or lower. However, by changing the material of each highly reflective structure, the process temperature may be appropriately changed. Hereinafter, an example of forming the film on the substrate 1 using the source gas and the reactive gas will be described with reference to FIG. 10. In the present embodiments, the process temperature is 500° C. or higher and 600° C. or lower.

In the film-forming process according to the present embodiments, the film is formed on the substrate 1 by performing a cycle a predetermined number of times (once or more). The cycle may include: a step of supplying the source gas with respect to the substrate 1 in the process chamber 14; a step of removing the source gas (residual gas) from the process chamber 14; a step of supplying the reactive gas with respect to the substrate 1 in the process chamber 14; and a step of removing the reactive gas (residual gas) from the process chamber 14. The steps in the cycle are performed non-simultaneously.

Further, steps of the process (for example, a cyclic film-forming step) different from the steps of the process shown in FIG. 9 will be described, and descriptions of the same steps as those of the process shown in FIG. 9 will be omitted. Therefore, since the substrate loading step (the step S1), the pressure and temperature adjusting step (the step S2) are already described in detail, the descriptions thereof will be omitted.

Film-forming Step

When the inner temperature of the process chamber 14 is stabilized at a pre-set process temperature and the pressure of the process chamber 14 is stabilized at a pre-set process pressure, four steps described below, that is, a step S3 through a step S6, are sequentially performed.

Source Gas Supply Step S3

In the present step, the source gas is supplied with respect to the substrate 1 in the process chamber 14.

In the step S3, the source gas is introduced into the process chamber 14 through the gas introduction pipe 22, and a flow rate of the source gas is adjusted by the gas flow rate controller 24. Then, the source gas whose flow rate is adjusted is supplied to the process chamber 14 of the inner tube 13, and is exhausted through the exhaust flow path 17 and the exhaust pipe 18. Simultaneously, a flow rate of the $N_2$ gas is adjusted by the gas flow rate controller 24. The $N_2$ gas whose flow rate is adjusted is supplied to the process chamber 14 with the source gas, and is exhausted through the exhaust pipe 18. By supplying the source gas with respect to the substrate 1, for example, a first layer whose thickness is within a range from less than one atomic layer to several atomic layers is formed on a top surface of the substrate 1.

Purge Gas Supply Step S4

After the first layer is formed on the substrate 1, the supply of the source gas is stopped. In the step S4, the exhauster 19 vacuum-exhausts the process chamber 14 to discharge a residual source gas in the process chamber 14 which did not react or which did contribute to the formation of the first layer from the process chamber 14. In the step S4, the $N_2$ gas is continuously supplied into the process chamber 14. The $N_2$ gas acts as the purge gas, which improves the efficiency of discharging (removing) the residual gas remaining in the process chamber 14 from the process chamber 14.

Reactive Gas Supply Step S5

After the step S4 is completed, the reactive gas is supplied with respect to the substrate 1 in the process chamber 14 (that is, with respect to the first layer formed on the substrate 1 in the process chamber 14). In the step S5, the reactive gas is thermally activated and then supplied with respect to the substrate 1.

In the present step, the reactive gas is introduced into the process chamber 14 through the gas introduction pipe 22, and a flow rate of the reactive gas is adjusted by the gas flow rate controller 24. Then, the reactive gas whose flow rate is adjusted is supplied to the process chamber 14 of the inner tube 13, and is exhausted through the exhaust flow path 17 and the exhaust pipe 18. Simultaneously, the flow rate of the $N_2$ gas is adjusted by the gas flow rate controller 24. The $N_2$ gas whose flow rate is adjusted is supplied to the process chamber 14 with the reactive gas, and is exhausted through the exhaust pipe 18. Thereby, the reactive gas is supplied with respect to the substrate 1. The reactive gas supplied with respect to the substrate 1 reacts with at least a portion of the first layer formed on the substrate 1 in the step S3. As a result, the first layer is thermally nitrided under a non-plasma atmosphere and changed (modified) into a second layer.

Purge Gas Supply Step S6

After the second layer is formed, the supply of the reactive gas is stopped. The exhauster 19 vacuum-exhausts the process chamber 14 to discharge a residual reactive gas in the process chamber 14 which did not react or which did contribute to the formation of the second layer or the reaction by-products from the process chamber 14 in the same manner as in the step S4. Similar to the step S4, the gas remaining in the process chamber 14 may not be completely discharged.

Performing a Predetermined Number of Times: Step S7

The cycle in which the four steps described above are performed non-simultaneously is performed a predetermined number of times (n times) until the film of a predetermined thickness is formed on the substrate 1. It is preferable that the cycle is repeatedly performed until the film of the predetermined thickness is obtained by controlling the second layer formed in each cycle to be thinner than the film of the predetermined thickness and stacking the second layer by repeatedly performing the cycle. That is, it is preferable that the cycle is performed a plurality of times.

Figure 9:
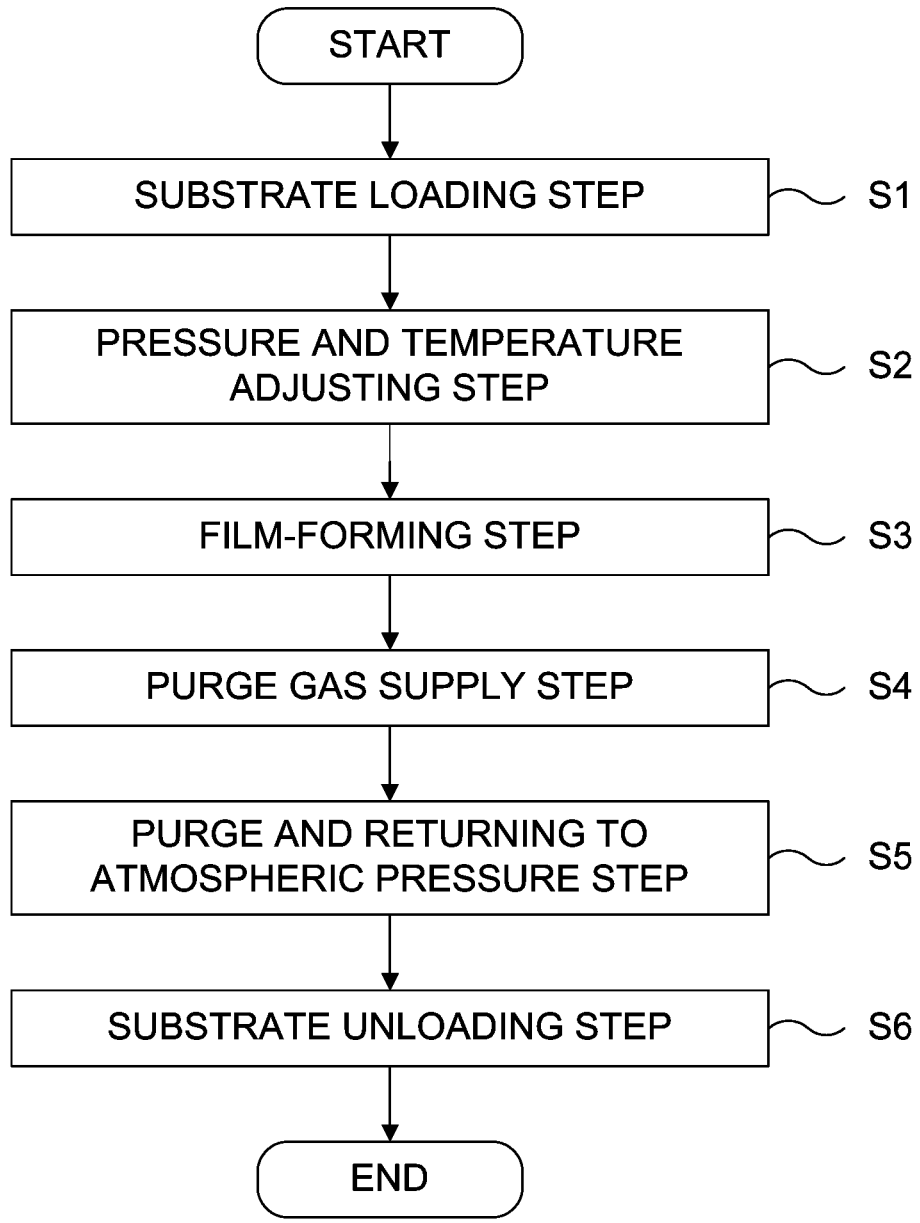
FIG. 9 is a flow chart schematically illustrating a substrate processing according to the embodiments of the present disclosure.
Figure 10:
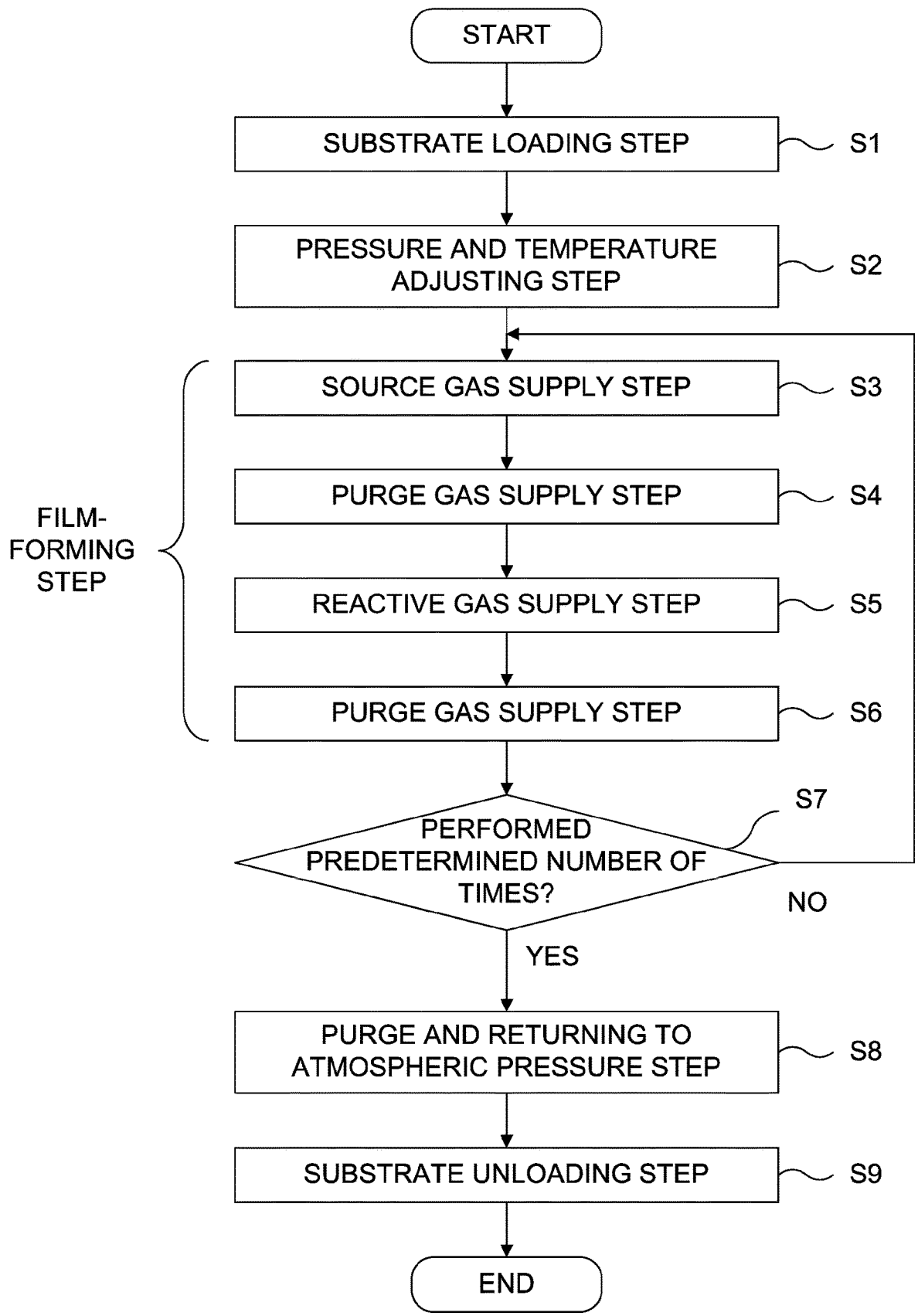
FIG. 10 is a flow chart schematically illustrating a substrate processing according to another embodiment of the present disclosure.

Since a purge and returning to atmospheric pressure step (a step S8) and a substrate unloading step (a step S9) are substantially the same as the purge and returning to atmospheric pressure step (the step S5) and the substrate unloading step (the step S6) shown in FIG. 9, respectively, the descriptions thereof will be omitted.

According to the present embodiments, by arranging the first highly reflective structure 120 whose infrared reflectance is high in the heat insulating plate region 36, arranging the second highly reflective structure 126 at the holder provided at an inner portion of the upper end of the manifold 16 and arranging the third highly reflective structure 128 radially outward of the outer tube 12, it is possible to suppress the heat leakage toward the manifold 16 provided below the substrate processing region 35 and the cooling ring 130 and the heat leakage toward the side surface direction.

Further, while the embodiments described above are described by way of an example in which the film is formed on the substrate, a film type is not particularly limited thereto. For example, the technique of the present disclosure may also be applied to form various types of films such as a nitride film such as a silicon nitride film (SiN film) and a metal nitride film and an oxide film such as a silicon oxide film (SiO film) and a metal oxide film.

For example, while the embodiments described above are described based on the substrate processing apparatus, the technique of the present disclosure may also be generally applied to a semiconductor manufacturing apparatus. Further, the technique of the present disclosure is not limited to the semiconductor manufacturing apparatus, and may also be applied to a processing apparatus configured to process a glass substrate such as an LCD (Liquid Crystal Display) device.

The entire contents of Japanese Patent Application No. 2020-50144, filed on Mar. 19, 2020, are hereby incorporated in the present specification by reference. All documents, patent applications, and technical standards described herein are hereby incorporated in the present specification by reference to the same extent that the contents of each of the documents, the patent applications and the technical standards are specifically described.

According to some embodiments of the present disclosure, it is possible to provide the technique (or the configuration) capable of suppressing the decrease in the temperature of the process chamber.

What is claimed is:

1. A substrate processing apparatus comprising:
   a substrate retainer provided with a heat insulating region at a lower portion thereof, wherein a heat insulator is provided in the heat insulating region;
   a first reaction tube with open upper and lower ends and in which the substrate retainer is accommodated;
   a second reaction tube with a closed upper end and an open lower end;
   a furnace opening flange provided with a holder in a first space between the first reaction tube and the second reaction tube;
   a heater provided so as to cover the second reaction tube and configured to heat a substrate arranged in the substrate retainer in the first reaction tube;
   a first highly reflective structure whose infrared reflectance is higher than that of the heat insulator and provided in the heat insulating region; and
   a second highly reflective structure whose infrared reflectance is higher than that of the heat insulator and arranged at the holder provided at the furnace opening flange so as to be provided along an inner wall of the second reaction tube at a lower portion of the second reaction tube in the first space.

2. The substrate processing apparatus of claim 1, further comprising
   a third highly reflective structure whose infrared reflectance is higher than that of the heat insulator and provided in a second space provided between the heater and the second reaction tube.

3. The substrate processing apparatus of claim 2, wherein the infrared reflectance of each of the first highly reflective structure, the second highly reflective structure and the third highly reflective structure is equal to or higher than 80%.

4. The substrate processing apparatus of claim 2, wherein infrared reflectances of the first highly reflective structure, the second highly reflective structure and the third highly reflective structure are substantially equal to one another.

5. The substrate processing apparatus of claim 2, wherein the infrared reflectance of at least one among the first highly reflective structure, the second highly reflective structure and the third highly reflective structure is different from the others among the first highly reflective structure, the second highly reflective structure and the third highly reflective structure.

6. The substrate processing apparatus of claim 2, wherein a thickness of each of the first highly reflective structure, the second highly reflective structure and the third highly reflective structure is thinner than that of the heat insulator.

7. The substrate processing apparatus of claim 2, wherein at least one of the second highly reflective structure or the third highly reflective structure is configured to form a reflective film on a surface of the second reaction tube.

8. The substrate processing apparatus of claim 2, wherein at least one of the second highly reflective structure or the third highly reflective structure is configured to be provided on a surface of the second reaction tube.

9. The substrate processing apparatus of claim 2, wherein an uppermost end of the third highly reflective structure is located higher than an uppermost end of the second highly reflective structure.

10. The substrate processing apparatus of claim 2, wherein at least one of the second highly reflective structure or the third highly reflective structure is arranged at a position facing the heater and below a substrate processing region in which the substrate is accommodated.

11. The substrate processing apparatus of claim 2, wherein the first highly reflective structure, the second highly reflective structure and the third highly reflective structure are arranged at positions facing the heat insulating region and facing the heater.

12. The substrate processing apparatus of claim 1, further comprises
a cooling ring provided between the second reaction tube and the furnace opening flange.

13. The substrate processing apparatus of claim 12, wherein the cooling ring is provided outside the first space.

14. The substrate processing apparatus of claim 12, wherein the cooling ring is provided between the second reaction tube and the furnace opening flange via a seal.

15. A heat insulator assembly provided in a process chamber constituted by: a second reaction tube arranged outside a first reaction tube into which a substrate retainer provided with a heat insulating region is transferred, wherein a heat insulator is provided in the heat insulating region; and a furnace opening flange provided with a holder in a first space between the first reaction tube and the second reaction tube, the heat insulator assembly comprising:
  a first highly reflective structure whose infrared reflectance is higher than that of the heat insulator and provided in the heat insulating region; and
  a second highly reflective structure whose infrared reflectance is higher than that of the heat insulator and arranged at the holder provided at the furnace opening flange so as to be provided along an inner wall of the second reaction tube at a lower portion of the second reaction tube in the first space.

16. A method of manufacturing a semiconductor device, comprising:
  (a) transferring a plurality of substrates into a process chamber by transferring a substrate retainer comprising a substrate processing region in which the plurality of substrates are accommodated and a heat insulating region in which a heat insulator is provided into a first reaction tube with open upper and lower ends while the plurality of substrates are accommodated in the substrate retainer, wherein the process chamber is provided in a furnace opening flange provided at a lower portion of a second reaction tube with a closed upper end and an open lower end and provided with a holder in a first space between the first reaction tube and the second reaction tube; and
  (b) processing the plurality of substrates while heating the process chamber, wherein the process chamber is provided with:
    a first highly reflective structure whose infrared reflectance is higher than that of the heat insulator and provided in the heat insulating region; and
    a second highly reflective structure whose infrared reflectance is higher than that of the heat insulator and arranged at the holder provided at the furnace opening flange so as to be provided along an inner wall of the second reaction tube at a lower portion of the second reaction tube in the first space.

* * * * *